US006706562B2

(12) United States Patent
Mahajan et al.

(10) Patent No.: US 6,706,562 B2
(45) Date of Patent: Mar. 16, 2004

(54) ELECTRONIC ASSEMBLY WITH HIGH CAPACITY THERMAL SPREADER AND METHODS OF MANUFACTURE

(75) Inventors: Ravi V. Mahajan, Tempe, AZ (US); Gregory M. Chrysler, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 46 days.

(21) Appl. No.: 10/036,846

(22) Filed: Dec. 21, 2001

(65) Prior Publication Data

US 2002/0105071 A1 Aug. 8, 2002

Related U.S. Application Data

(63) Continuation-in-part of application No. 09/737,117, filed on Dec. 14, 2000.

(51) Int. Cl.[7] .............................................. H01L 23/10
(52) U.S. Cl. ....................................... 438/125; 438/122
(58) Field of Search ................................ 257/704, 712, 257/706, 707, 737, 778, 713; 438/125, 122

(56) References Cited

U.S. PATENT DOCUMENTS

| | | | |
|---|---|---|---|
| 5,291,064 A | 3/1994 | Kurokawa | 257/714 |
| 5,508,230 A | 4/1996 | Anderson et al. | 437/183 |
| 5,895,972 A | 4/1999 | Paniccia | 257/706 |
| 5,907,189 A | * 5/1999 | Mertol | 257/787 |
| 5,985,412 A | 11/1999 | Gosele | 428/172 |
| 6,118,177 A | 9/2000 | Lischner et al. | 257/706 |
| 6,245,249 B1 | 6/2001 | Yamada et al. | 216/33 |
| 6,317,326 B1 | 11/2001 | Vogel et al. | 361/704 |
| 6,390,181 B1 | 5/2002 | Hall et al. | 165/80.3 |

OTHER PUBLICATIONS

Suga, T., et al., "A new wafer–bonder of ultra–high precision using surface activated bonding (SAB) concept", *Proceedings of the 2001 IEEE Electronic components and Technology Conference*, 6 pgs, (May 1, 2001–Jun. 1,).

Takagi, H., et al., "Surface activated bonding of silicon wafers at room temperature", *Applied Physics Letter, vol. 68*, 2222–2224, (Apr. 1996).

* cited by examiner

*Primary Examiner*—Roy Potter
(74) *Attorney, Agent, or Firm*—Schwegman, Lundberg, Woessner & Kluth, P.A.

(57) ABSTRACT

To accommodate high power densities associated with high performance integrated circuits, an integrated circuit package includes a heat-dissipating structure in which heat is dissipated from a surface of one or more dice to an integrated heat spreader (IHS) through a high capacity thermal spreader formed of diamond, a diamond composite, or graphite. In one embodiment, a diamond layer is grown on the IHS. In another embodiment, a diamond layer is separately formed and affixed to the IHS and/or to the die through soldering or through a room temperature surface activated bonding (SAB) process. Methods of fabrication, as well as application of the package to an electronic assembly and to an electronic system, are also described.

23 Claims, 9 Drawing Sheets

ELECTRONIC ASSEMBLY WITH HIGH CAPACITY THERMAL SPREADER AND METHODS OF MANUFACTURE

RELATED APPLICATIONS

This application is a continuation-in-part of co-pending U.S. patent application Ser. No. 09/737,117, filed Dec. 14, 2000, entitled "ELECTRONIC ASSEMBLY WITH HIGH CAPACITY THERMAL INTERFACE AND METHODS OF MANUFACTURE" which is assigned to the same assignee as the present application.

The present application is related to the following applications which are assigned to the same assignee as the present application:

(1) Ser. No. 09/920,275, entitled "An Electronic Assembly Including A Die Having An Intergrated Circuit And A Layer Of Diamond To Transfer Heat"; and (2) Ser. No. 10/074,043, entitled "Diamond Intergrated Heat Spreader and Method of Manufacturing Same".

TECHNICAL FIELD

The present invention relates generally to electronics packaging. More particularly, the present invention relates to an electronic assembly that includes an integrated circuit package comprising a high capacity thermal spreading element between the integrated circuit and a heat spreader to dissipate heat generated in a high performance integrated circuit, and to manufacturing methods related thereto.

BACKGROUND INFORMATION

Integrated circuits (IC's) are typically assembled into packages by physically and electrically coupling them to a substrate made of organic or ceramic material. One or more IC packages can be physically and electrically coupled to a printed circuit board (PCB) to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

In the field of electronic systems there is an incessant competitive pressure among manufacturers to drive the performance of their equipment up while driving down production costs. This is particularly true regarding the packaging of IC's on substrates, where each new generation of packaging must provide increased performance, particularly in terms of an increased number of components and higher clock frequencies, while generally being smaller or more compact in size. As the density and clock frequency of IC's increase, they accordingly generate a greater amount of heat. However, the performance and reliability of IC's are known to diminish as the temperature to which they are subjected increases, so it becomes increasingly important to adequately dissipate heat from IC environments, including IC packages.

An IC substrate may comprise a number of metal layers selectively patterned to provide metal interconnect lines (referred to herein as "traces"), and one or more electronic components mounted on one or more surfaces of the substrate. The electronic component or components are functionally connected to other elements of an electronic system through a hierarchy of electrically conductive paths that include the substrate traces. The substrate traces typically carry signals that are transmitted between the electronic components, such as IC's, of the system. Some IC's have a relatively large number of input/output (I/O) terminals (also called "lands"), as well as a large number of power and ground terminals or lands.

As the internal circuitry of IC's, such as processors, operates at higher and higher clock frequencies, and as IC's operate at higher and higher power levels, the amount of heat generated by such IC's can increase their operating temperature to unacceptable levels.

For the reasons stated above, and for other reasons stated below which will become apparent to those skilled in the art upon reading and understanding the present specification, there is a significant need in the art for apparatus and methods for packaging an IC on a substrate that minimize heat dissipation problems associated with high clock frequencies and high power densities.

DETAILED DESCRIPTION

In the following detailed description of embodiments of the inventive subject matter, reference is made to the accompanying drawings which form a part hereof, and in which is shown by way of illustration specific preferred embodiments in which the inventive subject matter may be practiced. These embodiments are described in sufficient detail to enable those skilled in the art to practice the inventive subject matter, and it is to be understood that other embodiments may be utilized a that structural, mechanical, compositional, and electrical changes may be made without departing from the spirit and scope of the inventive subject matter. The following detailed description is, therefore, not to be taken in a limiting sense, and the scope of embodiments of the inventive subject matter is defined only by the pended claims. Such embodiments of the inventive subject matter may be referred to, individually and/or collectively, herein by the term "invention" merely for convenience and without intending to voluntarily limit the scope of this application to any single invention or inventive concept if more than one is in fact disclosed.

The present invention provides a solution to thermal dissipation problems that are associated with prior art packaging of integrated circuits that have high circuit density and that operate at high clock speeds and high power levels, by employing a high capacity thermal spreader material between one or more IC's and a heat spreader, and/or between a heat spreader and a heat sink. Various embodiments are illustrated and described herein.

In one embodiment, a front surface of an IC die is flip-chip mounted to an organic land grid array (OLGA) substrate using "controlled collapse chip connect" (C4) technology. A high capacity thermal spreader material is attached between the back surface of the die and an integrated heat spreader (IHS) after suitable preparation of the die and IHS surfaces. In one embodiment, the high capacity thermal spreader material comprises diamond, a diamond composite, or graphite. In one embodiment, a diamond layer is grown on the IHS. In another embodiment, a diamond layer is separately formed and affixed to the IHS or to the die through a suitable process, such as by soldering or with a room temperature surface activated bonding (SAB) process. A side wall of the IHS can also be coupled to the OLGA substrate around the die periphery with a suitable thermal sealant in order to provide further heat dissipation as well as mechanical strength.

Figure 1:
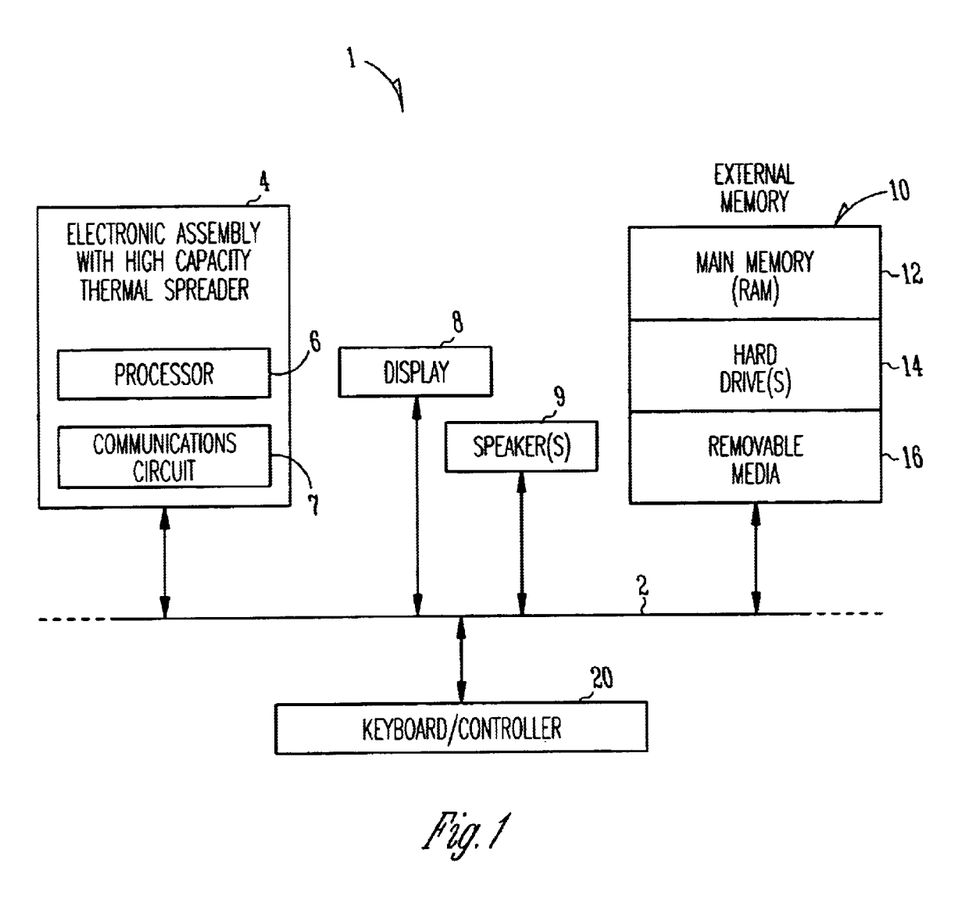
FIG. 1 is a block diagram of an electronic system incorporating at least one electronic assembly with a high capacity thermal spreader in accordance with one embodiment of the invention.

FIG. 1 is a block diagram of an electronic system 1 incorporating at least one electronic assembly 4 with a high capacity thermal spreader in accordance with one embodiment of the invention. Electronic system 1 is merely one example of an electronic system in which the present invention can be used. In this example, electronic system 1 comprises a data processing system that includes a system bus 2 to couple the various components of the system. System bus 2 provides communications links among the various components of the electronic system 1 and can be implemented as a single bus, as a combination of busses, or in any other suitable manner.

Electronic assembly 4 is coupled to system bus 2. Electronic assembly 4 can include any circuit or combination of circuits. In one embodiment, electronic assembly 4 includes a processor 6 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in electronic assembly 4 are a custom circuit, an application-specific integrated circuit (ASIC), or the like, such as, for example, one or more circuits (such as a communications circuit 7) for use in wireless devices like cellular telephones, pagers, portable computers, two-way radios, and similar electronic systems. The IC can perform any other type of function.

Electronic system 1 can also include an external memory 10, which in turn can include one or more memory elements suitable to the particular application, such as a main memory 12 in the form of random access memory (RAM), one or more hard drives 14, and/or one or more drives that handle removable media 16 such as floppy diskettes, compact disks (CDs), digital video disk (DVD), and the like.

Electronic system 1 can also include a display device 8, one or more speakers 9, and a keyboard and/or controller 20, which can include a mouse, trackball, game controller, voice-recognition device, or any other device that permits a system user to input information into and receive information from the electronic system 1.

Figure 2:
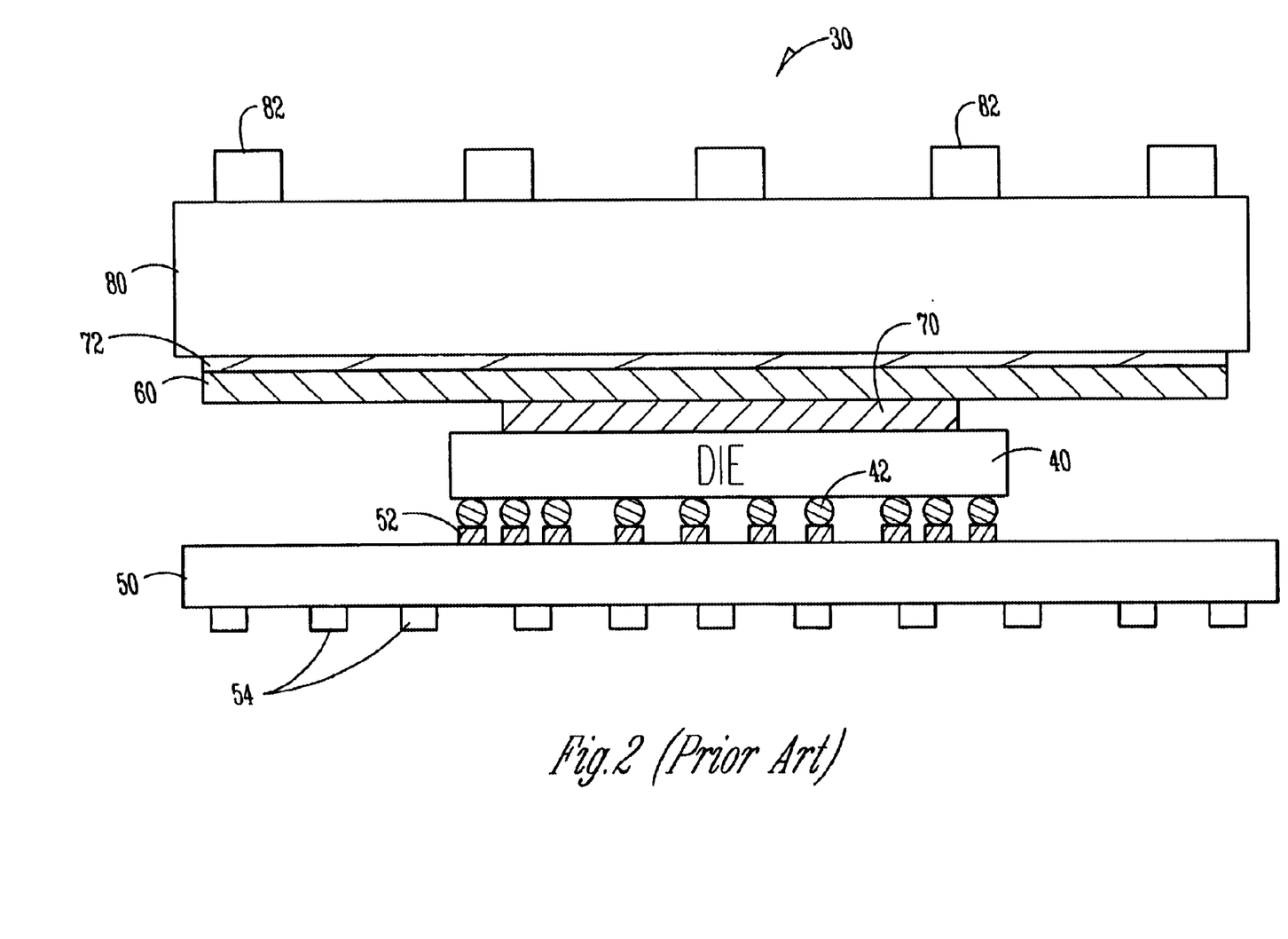
FIG. 2 illustrates a cross-sectional representation of a prior art IC package.

FIG. 2 illustrates a cross-sectional representation of a prior art IC package 30. IC package 30 represents a typical prior art structure that includes an IC die 40 mounted in "flip-chip" orientation with its lands (not shown) facing downward to couple with corresponding lands 52 on the upper surface of a substrate 50 through solder balls or bumps 42. Substrate 50 can be a one-layer board or a multi-layer board, and it can include additional lands 54 on its opposite surface for mating with additional packaging structure (not shown).

Die 40 generates its heat from internal structure, including wiring traces, that is located near its lower surface; however, most of the heat is dissipated through its upper surface. Heat that is concentrated within die 40 is dissipated to a large surface that is in contact with die 40 in the form of a heat spreader 60 that is typically formed of metal such as copper or aluminum. To improve the thermal conductivity between die 40 and the heat spreader 60, a thermal interface 70 of thermally conductive material is often provided between die 40 and heat spreader 60. The thermal interface 70 typically is solder, a thermal gel or grease containing metal particles, or a phase-change material.

To further dissipate heat from heat spreader 60, a heat sink 80 optionally having heat fins 82 is often coupled to heat spreader 60. Heat sink 80 dissipates heat into the ambient environment. To improve thermal conductivity between heat spreader 60 and heat sink 80, a second thermal interface 72 is often provided between heat spreader 60 and heat sink 80.

An increase in the junction temperature $T_j$ of an electronic device on the IC can adversely affect the operating lives of the device. Junction temperature is a function of three factors: junction-to-ambient thermal resistance, power dissipation, and ambient temperature. $T_j$ can be expressed by Equation 1:

$$T_j = (\theta_{ja} \times P_d) + T_a \qquad \text{(Equation 1)}$$

wherein $T_j$=junction temperature (in degrees C.);

$\theta_{ja}$=the junction-to-ambient thermal resistance (in degrees C./watt);

$P_d$=power dissipation at $T_j$ (in watts); and $T_a$=ambient temperature (in degrees C.).

The junction-to-ambient thermal resistance $\theta_{ja}$ can be represented by Equation 2:

$$\theta_{ja}=\theta_{jc}+\theta_{cs}+\theta_{sa} \quad \text{(Equation 2)}$$

wherein $\theta_{jc}$=the junction-to-case thermal resistance (in degrees C./watt);

$\theta_{cs}$=the case-to-sink thermal resistance (in degrees C./watt); and $\theta_{sa}$=the sink-to-ambient thermal resistance (in degrees C./watt);

In the foregoing definitions, the pertinent location of the case is the top center of the IC package, including any IHS forming part of the IC package. The pertinent location of the sink can be the geometric center of the heat sink.

The IC package 30 of FIG. 2 is for most purposes no longer capable of meeting the thermal-dissipating requirements of today's high performance electronic assemblies, as expressed in terms of the junction-to-ambient thermal resistance $\theta_{ja}$.

The present invention reduces the device junction temperature $T_j$ by reducing the junction-to-case thermal resistance $\theta_{jc}$, the case-to-sink thermal resistance $\theta_{cs}$ and the sink to ambient resistance $\theta_{sa}$ Processor assemblies for high performance servers have a very non-uniform power map or heat flux variation across the surfaces of the die. In a 3D thermal mapping, the hot spots appear as mountain peaks across the upper die surface, for example. It is the temperature of the highest flux area(s) that typically must be maintained at or below a specified value. While the silicon die provides some lateral heat spreading, it is insufficient to appreciably reduce the peak temperature(s).

Even the high thermal conductivity of copper (which is greater than three times that of silicon) is insufficient to handle the hot spots. If existing thermal dissipation structure is incapable of dissipating sufficient heat to maintain the die peak temperature below a specified value, the performance of the electronic assembly must be throttled back by reverting to a temperature-dependent processor power control process. Otherwise, the electronic assembly could malfunction or experience a catastrophic failure. Thus, with increased heat dissipation requirements for electronic assemblies, it has become necessary to substantially improve the performance of thermal dissipating materials and integrated heat spreaders.

Figure 3:
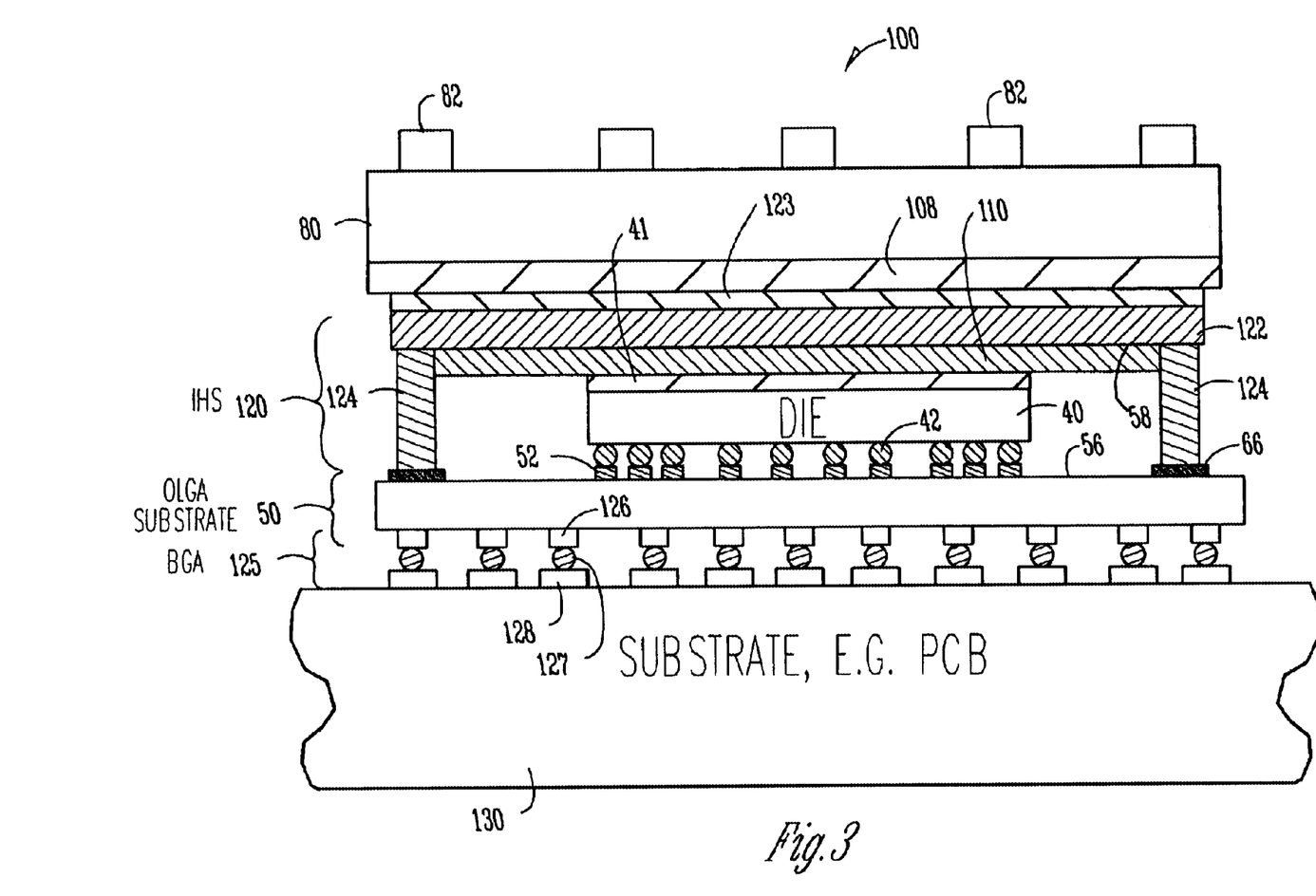
FIG. 3 illustrates a cross-sectional representation of an electronic assembly comprising an IC package with a high capacity thermal spreader, in accordance with one embodiment of the invention.

FIG. 3 illustrates a cross-sectional representation of an electronic assembly 100 comprising an IC package with a high capacity thermal spreader 110, in accordance with one embodiment of the invention. The IC package comprises a die 40 mounted on an organic land grid array (OLGA) substrate 50, and an integrated heat spreader (IHS) 120. While an OLGA substrate is shown, the present invention is not limited to use with an OLGA substrate, and any other type of substrate can be employed. The IC package illustrated in FIG. 3 can form part of electronic assembly 4 shown in FIG. 1. Die 40 can be of any type. In one embodiment, die 40 is a processor.

In FIG. 3, die 40 comprises a plurality of signal conductors (not shown) that terminate in electrical contacts or lands on the bottom surface (not shown) of die 40. These lands can be coupled to corresponding electrical contacts or lands 52 representing signal, power, or ground nodes on the upper surface 56 of OLGA substrate 50 by appropriate connections such as C4 solder bumps 42. A suitable underfill (not shown), such as an epoxy material, can be used to surround C4 solder bumps 42 to provide mechanical stability and strength.

Still referring to FIG. 3, an integrated heat spreader (IHS) 120 forms a cover over die 40. IHS 120 is thermally coupled to an upper surface of die 40 through a thermal interface 41 and a high capacity thermal spreader 110. Die 40 can thus dissipate a substantial amount of heat both laterally and vertically through thermal spreader 110 to IHS 120. Thermal interface 41 can be of any suitable type, including solder, a thermal gel or grease containing metal particles, or a phase change material.

To further increase the rate of heat dissipation from IHS 120, a heat sink 80 of any suitable shape (including optional heat fins 82), material, and size can optionally be coupled to or formed as part of the upper surface of the lid 122 of IHS 120.

In one embodiment, the lid 122 of IHS 120 is thermally coupled to heat sink 80 through a second thermal interface 123 and another high capacity thermal spreader 108. IHS 120 can thus dissipate a substantial amount of heat both laterally and vertically through thermal spreader 108.

Thermal spreaders 108 and 110 comprise a material that is capable of conducting heat at a high rate. In one embodiment, thermal spreaders 108 and 110 comprise diamond. A layer of thermal spreader 108 or 110 comprising diamond has a very high thermal conductivity in all directions within the layer. In other embodiments, thermal spreaders 108 and 110 can comprise other materials with thermal qualities that are only slightly inferior to diamond, such as a diamond composite, or graphite. A suitable diamond composite can comprise a mixture of diamond particles and particles of another substance, such as aluminum or copper. While graphite is an excellent thermal conductor within a given plane of graphite material, it is not a good thermal conductor in a direction that is normal to a plane. However, graphite may suffice for applications that do not require maximum thermal dissipation.

IHS 120 includes a lid 122 and a side wall or support member 124. Thermal spreader 110 is in contact with the lower surface 58 of lid 122 and with the upper surface of die 40 through thermal interface 41. In one embodiment, thermal spreader 110 is affixed to die 40 and/or to lid 122.

Thermal spreader 110 can be formed in at least two different ways. For example, thermal spreader 110 can be formed by growing it on the lower surface 58 of lid 122 or by growing it on the upper surface of die 40, as explained further regarding FIG. 5. Alternatively, thermal spreader 110 can be formed apart from IHS 120 and subsequently affixed to lid 122 of IHS 120 and/or to die 40, as explained further regarding FIGS. 6 and 7.

In those embodiments wherein thermal spreader 110 is physically affixed to die 40 and/or lid 122 of IHS 120, for example, through an SAB process, the corresponding thermal interface layer(s) are dispensed with. For example, if thermal spreader 110 is attached to die 40 through an SAB process, thermal interface 41 is eliminated.

Thermal spreader 108 can also be formed in at least two different ways. For example, thermal spreader 108 can be formed by growing it on the lower surface of heat sink 80 or by growing it on the upper surface of lid 122 of IHS 120, as explained further regarding FIG. 5. Alternatively, thermal spreader 108 can be separately formed and subsequently affixed to heat sink 80 and/or to lid 122 of IHS 120, as explained further regarding FIGS. 6 and 7.

In those embodiments wherein thermal spreader 108 is physically affixed to heat sink 80 and/or lid 122 of IHS 120, for example, through an SAB process, the corresponding thermal interface layer(s) are dispensed with. For example, if thermal spreader 108 is attached to lid 122 of IHS 120 through an SAB process, thermal interface 123 is eliminated.

In one embodiment, thermal spreader 108 has a surface area that is substantially the same as the bottom surface area of heat sink 80. As viewed, for example, in FIG. 3, thermal spreader 108 covers substantially the entire bottom surface of heat sink 80. Alternatively, thermal spreader 108 could cover only the top surface of lid 122, or it could be sized in any other suitable manner.

In one embodiment, thermal spreader 110 has a surface area that is substantially the same as the bottom surface area of lid 122. As viewed, for example, in FIG. 3, thermal spreader 110 covers substantially the entire bottom surface of lid 122. Thermal spreader 110 can extend laterally to be in contact with support member 124, or it could be sized in any other suitable manner.

IHS 120 can be mechanically supported by coupling its support member 124 to the upper surface 56 of OLGA substrate 50 through a suitable sealant 66. In one embodiment, the support member 124 is located at the periphery of IHS 120. However, in other embodiments the lid 122 of IHS 120 can extend beyond the support member 124.

Sealant 66 can comprise a thermally conductive material such as a thermal grease or gel, or a heat-curable material such as a thermo-setting resin or epoxy. The thermally conductive material can comprise particles of metal or other thermally conductive substance(s).

OLGA substrate 50 can be of any type, including a multi-layer substrate. OLGA substrate 50 can be mounted to an additional substrate 130, such as a printed circuit board (PCB) or card. OLGA substrate 50 can comprise, for example, a plurality of lands 126 that can be mechanically and electrically coupled to corresponding lands 128 of substrate 130 by suitable connectors such as ball grid array (BGA) solder balls 127.

While a BGA arrangement 125 is illustrated in FIG. 3 for coupling OLGA substrate 50 to substrate 130, the present invention is not limited to use with a BGA arrangement, and it can be used with any other type of packaging technology. Further, the present invention is not to be construed as limited to use in C4 packages, and it can be used with any other type of IC package where the herein-described features of the present invention provide an advantage.

Figure 4:
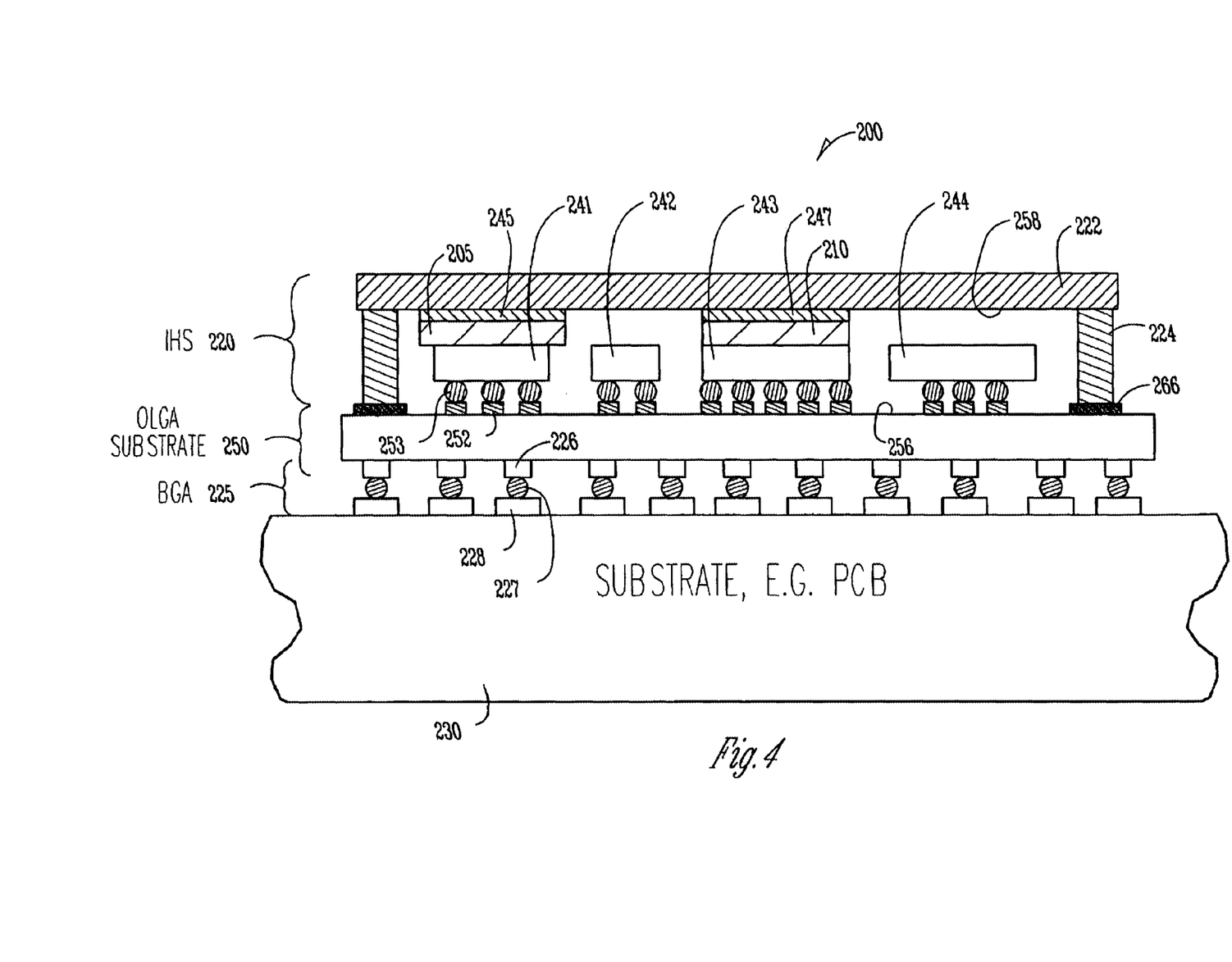
FIG. 4 illustrates a cross-sectional representation of an electronic assembly comprising a multi-chip IC package with a high capacity thermal spreader, in accordance with another embodiment of the invention.

FIG. 4 illustrates a cross-sectional representation of an electronic assembly 200 comprising a multi-chip IC package with several high capacity thermal spreaders 205 and 210, in accordance with another embodiment of the invention. While the embodiment shown in FIG. 3 has been described with reference to a single IC device, the invention is not limited to packaging single IC's and can be used for packaging multiple IC's. One example is the multi-chip IC package or multi-chip module shown in FIG. 4.

Electronic assembly 200 comprises a plurality of IC's in the form of dice 241–244, which are mounted to lands 252 on an upper surface 256 of substrate 250 (which can be an OLGA substrate) via corresponding solder balls or bumps 253. While an OLGA substrate is shown, the invention is not limited to use with an OLGA substrate, and any other type of substrate can be employed. The multi-chip module illustrated in FIG. 4 can form part of electronic assembly 4 shown in FIG. 1. Dice 241–244 can be of any type. In one embodiment, die 243 is a processor.

It is assumed for the sake of this example that certain ones of dice 241–244 are high heat producers, and they are accordingly coupled to IHS 220 through corresponding high capacity thermal spreaders. For example, dice 241 and 243 are assumed to generate high thermal outputs and are thermally coupled to the under side 258 of IHS 220 through high capacity thermal spreaders 205 and 210, respectively. Normally, the thermal spreader is wider than the die, as exemplified by thermal spreader 205. However, the width of the thermal spreader can alternatively be the same as or smaller than the width of the die, as exemplified by thermal spreader 210. Moreover, the dimensions of the thermal spreader can be tailored to the die hot spots. For example, one or more thermal spreaders can be positioned over a corresponding number of die hot spots.

If thermal spreaders 205 and 210 are not physically affixed to the underside 258 of IHS 220, for example, by an SAB process, then respective thermal interfaces 245 and 247 would be used between thermal spreaders 205 and 210 and the underside 258 of IHS 220, as shown in FIG. 4. Thermal spreaders 205 and 210 are in contact with the lower surface 258 of lid 222 and with the upper surfaces of dice 241 and 243, respectively, through thermal interfaces 245 and 247, respectively. IHS 220 includes a lid 222 and a side wall or support member 224. Thermal interfaces (not illustrated) could also be used between dice 242 and 244 and the underside 258 of IHS 220.

IHS 220 can be mechanically secured by coupling its support member 224 to the upper surface 256 of OLGA substrate 250 through a suitable sealant 266. As mentioned regarding FIG. 3, the support member 224 is shown located at the periphery of IHS 220; however, in other embodiments the lid 222 of IHS 220 can extend beyond the support member 224. To further increase the rate of heat dissipation from IHS 220, a heat sink (not shown) of any suitable shape, material, and size can optionally be coupled to or formed as part of the upper surface of the lid 222 of IHS 220.

OLGA substrate 250 can be of any type, including a multi-layer substrate. OLGA substrate 250 can be mounted to an additional substrate 230, such as a printed circuit board (PCB) or card. OLGA substrate 250 can comprise, for example, a plurality of lands 226 that can be mechanically and electrically coupled to corresponding lands 228 of substrate 230 by suitable connectors such as ball grid array (BGA) solder balls 227.

While a BGA arrangement 225 is illustrated in FIG. 4 for coupling OLGA substrate 250 to substrate 230, the present invention is not limited to use with a BGA arrangement, and it can be used with any other type of packaging technology. Further, the present invention is not to be construed as limited to use in C4 packages, and it can be used with any other type of IC package where the herein-described features of the present invention provide an advantage.

While in the embodiment shown in FIG. 4, individual thermal spreaders, such as thermal spreaders 205 and 210, have been provided for only certain dice, such as dice 241 and 243, in another embodiment of a multi-chip module, a continuous thermal spreader layer could be provided between all of the dice 241–244 and the lid 222 of IHS 220. Such a thermal spreader could have a surface area that is substantially coextensive with the bottom surface area of lid 222.

The fabrication of an IC package comprising a high capacity thermal spreader will now be described.

Fabrication

In order to successfully fabricate an IC package with the advantages described above, a layer of high capacity thermal spreader material, such as diamond, can be separately formed and attached to the appropriate surfaces. For example, in the case of thermal spreader 110 (FIG. 3), it can be attached to the under side of IHS 120 and/or to the top side of die 40. Alternatively, thermal spreader 110 can be grown on one surface (e.g. the under side of IHS 120) and attached to an adjacent surface (e.g. the top side of die 40); or it can be grown on the top side of die 40 and attached to the under side of IHS 120.

In an embodiment wherein high capacity thermal spreader 110 is separately formed, it is subsequently securely affixed to the under side of IHS 120 as well as to the top side of die 40. This can be accomplished in several different ways or through a combination of different ways.

In one embodiment, thermal spreader 110 is soldered to lid 122 of IHS 120 and to die 40. This requires that the surfaces of lid 122 and die 40 are readily solderable. It is also desirable to provide solderable surfaces on thermal spreader 110.

In another embodiment, thermal spreader 110 is affixed to lid 122 of IHS 120 and/or to die 40 using a room temperature surface activated bonding (SAB) process.

In an embodiment wherein thermal spreader 110 is grown on either lid 122 of IHS 120 or on die 40, it is also desirable that the exposed surface of thermal spreader 110 subsequently be securely affixed to the appropriate unattached surface of lid 122 or die 40. This can be accomplished using any suitable attachment method, such as by soldering or through an SAB process.

Similar to the various fabrication options described above, in the case of thermal spreader 108 (FIG. 3), it can be separately formed and subsequently attached to one or both surfaces of IHS 122 and heat sink 80, or it can be grown on one surface and subsequently attached to the other.

Each of the above-mentioned fabrication options will now be described in sufficient detail to enable one of ordinary skill in the art to understand and practice the invention.

Figure 5:
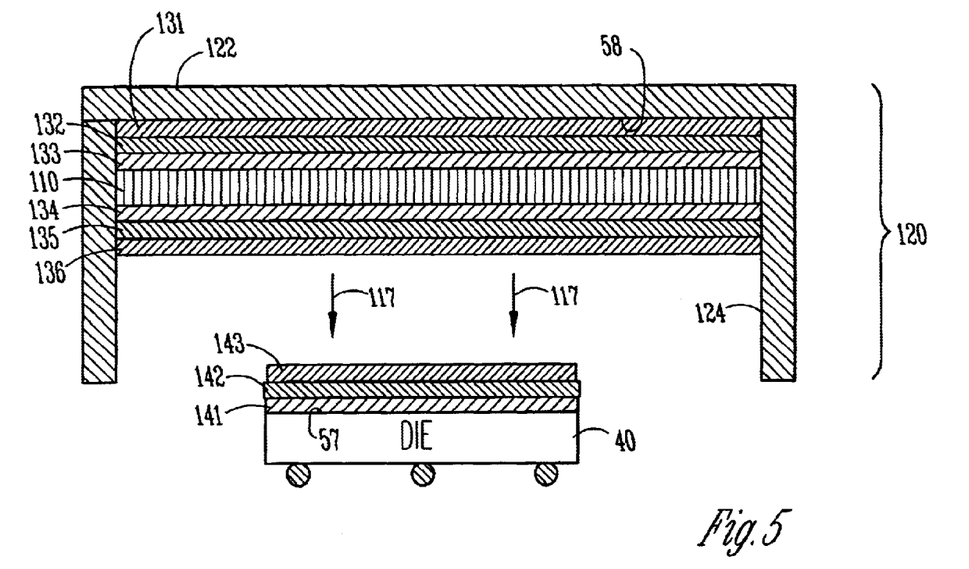
FIG. 5 illustrates a cross-sectional representation of a high capacity thermal spreader formed on an integrated heat spreader, in accordance with one embodiment of the invention.

FIG. 5 illustrates a cross-sectional representation of a high capacity thermal spreader 110 formed on an IHS 120, in accordance with one embodiment of the invention. As mentioned earlier, thermal spreader 110 (FIGS. 3 and 5) can be formed by growing it on the under surface 58 of lid 122. In one embodiment, a layer of amorphous or polycrystalline diamond is grown on surface 58 using suitable chemical deposition methods, such as chemical vapor deposition (CVD). Generally, polycrystalline diamond is preferred to amorphous diamond, because the former has superior heat-dissipating characteristics.

In order to grow a diamond layer on a bare (unplated) surface 58 of lid 122 of IHS 120, one or more adhesion layers 131–133 of a suitable material must first be affixed to surface 58. It is assumed that IHS 120 is formed of copper in this example, but it can be formed of different materials than copper.

The one or more adhesion layers 131–133 can comprise metal from a group that includes chromium, gold, nickel, platinum, silver, titanium, tungsten, and vanadium, or alloys thereof. Because diamond that is grown through a CVD process adheres well to titanium, titanium is generally used for layers that are in contact with diamond. However, tungsten could be substituted for titanium.

A layer 131 of nickel is first formed on surface 58 of lid 122.

Next a layer 132 of nickel-vanadium is formed on layer 131. Either platinum or chromium could be substituted for nickel-vanadium.

Next a layer 133 of titanium is formed on layer 132.

Next a thermal spreader layer 110 of diamond material is formed, for example using CVD, on the adhesion layer 133. The layer of thermal spreader 110 can be formed of a thickness that is suitable for the thermal requirements of the IC package. That is, it can be thicker for higher heat dissipation requirements, or thinner for less demanding heat dissipation requirements. The thickness of thermal spreader 110 can be, for example, 500 microns for high heat dissipation or 75 microns for lower heat dissipation.

To provide a suitable solderable surface on the lower surface of thermal spreader 110, one or more additional adhesion layers 134–136 are added.

In one embodiment, a layer 134 of titanium is first applied to thermal spreader layer 110.

Next a layer 135 of nickel-vanadium is formed on layer 134. Either platinum or chromium could be substituted for nickel-vanadium.

Finally a layer 136 of gold is formed on layer 135. Nickel could be substituted for gold.

In addition, one or more adhesion layers 141–143 can be formed on the upper surface 57 of die 40 in order to provide a suitable material for the lower-most adhesion layer 136 of IHS 120 to attach to.

In one embodiment, a layer 141 of titanium is formed on the upper surface 57 of die 40.

Next a layer 142 of nickel-vanadium is formed on layer 141. Either platinum or chromium could be substituted for nickel-vanadium.

Finally a layer 143 of gold is formed on layer 142. Nickel could be substituted for gold.

Prior to undergoing solder reflow, a suitable flux and solder paste are applied to one or both of layers 136 and 143, and IHS 120 is moved in the direction indicated by arrows 117, so that layer 136 comes into contact with layer 143.

In one embodiment, the titanium layers are approximately 200–500 Angstroms (A) in thickness; the nickel-vanadium layers are approximately 3500 A; and the gold layers are approximately 1000 A.

Instead of forming thermal spreader layer 110 on the lid 122 of IHS 120, thermal spreader layer 110 could be formed on the upper surface of die 40, as mentioned earlier, by appropriately changing the process described above for growing thermal spreader 110 on lid 122.

Also, instead of attaching the thermal spreader layer 110 to die 40 via a soldering process, it could be attached using an SAB process, as described further below.

Figure 6:
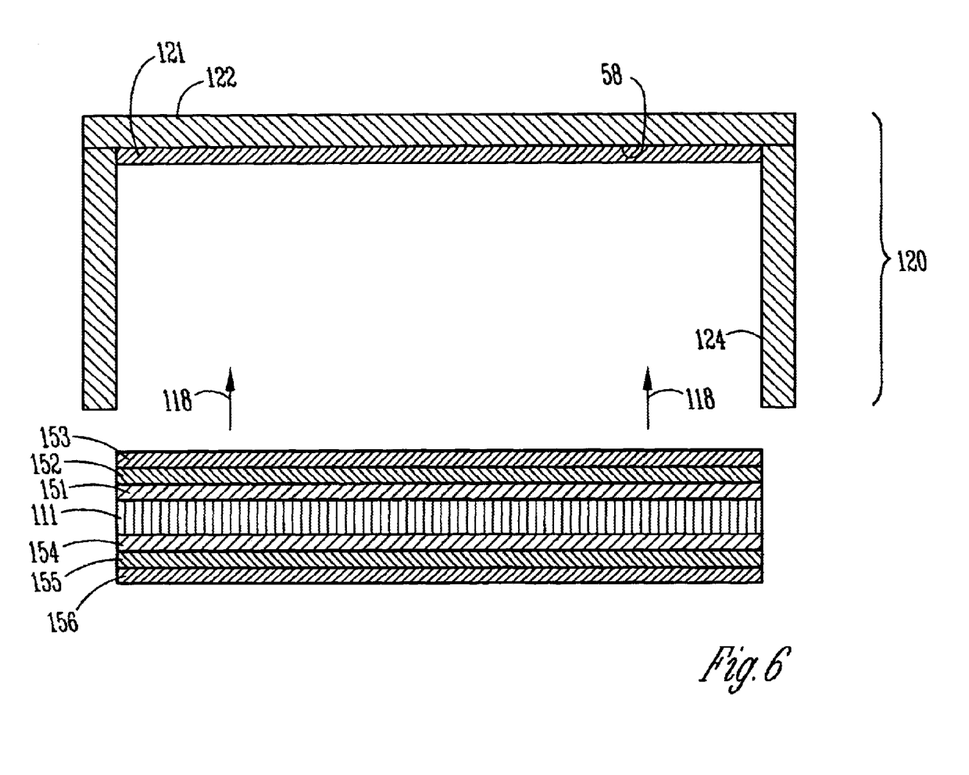
FIG. 6 illustrates a cross-sectional representation of a high capacity thermal spreader to be affixed to an integrated heat spreader, in accordance with another embodiment of the invention.

FIG. 6 illustrates a cross-sectional representation of a high capacity thermal spreader 111 to be affixed to an IHS 120, in accordance with another embodiment of the invention.

As mentioned earlier, the thermal spreader 111 can be formed apart from IHS 120 and subsequently affixed to the lower surface 58 of lid 122 of IHS 120, as will now be explained regarding FIGS. 6 and 7.

An amorphous or polycrystalline diamond layer 111 can be grown by any suitable method. The thickness of layer 111 can vary depending upon the thermal requirements of the IC package. In one embodiment, layer 111 is several hundred microns thick; however, the invention is not limited to any particular thickness.

To facilitate affixing the thermal spreader layer 111 to the under surface 58 of IHS 120, one or more adhesion layers 121 of suitable material can be formed on the under side 58 of lid 122. In addition, one or more adhesion layers 151–153 of suitable material can be formed on the upper surface of thermal spreader layer 111. In addition, one or more adhesion layers 154–156 of suitable material can be formed on the lower surface of thermal spreader layer 111 to provide a suitable bonding platform for a connection with the upper surface of die 40 (FIG. 5).

Adhesion layers 121 and 151–156 can comprise metal from a group that includes chromium, gold, nickel, platinum, silver, titanium, tungsten, and vanadium, or alloys of two or metals thereof. In one embodiment, layers 151 and 154 comprise titanium; layers 152 and 155 comprise nickel-vanadium; and layers 121, 153, and 156 comprise gold. However, as mentioned above regarding FIG. 5, other materials could be substituted for these particular substances.

Prior to undergoing solder reflow, a suitable flux and solder paste are applied to one or both of layers 121 and 153, and thermal spreader layer 111 is moved in the direction indicated by arrows 118, so that layer 153 comes into contact with layer 121.

While in the embodiments illustrated in FIGS. 5 and 6, thermal spreader 110 is described as being affixed to IHS 120 and to die 40 through the use of solder, or through growing thermal spreader 110 on lid 122 or IHS 120 or on die 40, other attachment techniques could also be used.

For example, a surface activated bonding (SAB) process can be used to affix a separately formed thermal spreader layer to one or more surfaces, such as a die, IHS, and/or heat sink. The SAB process can be carried out at room temperature, which can avoid warpage problems associated with the high temperatures (e.g. 400° to 600° C.) required with typical processes for the deposition of diamond material. Warpage can degrade thermal performance and negatively affect the process of assembling the thermal package components, including the IHS.

Even if diamond is deposited on silicon, which has a coefficient of thermal expansion (CTE) of 2–3 parts per million, which is close to the CTE of diamond (approximately 1 part per million), the relatively large cool-down range between 400° C. to room temperature (approximately 25° C.) can cause some undesirable warpage and induced stresses.

The use of a solder process to attach the thermal spreader layer to one or more surfaces subjects the components to a much lower temperature excursion than a deposition process, and it substantially eliminates thermally induced warpage. However, the solder presents an additional thermal layer through which heat must be transferred, and it thus does not provide as significant heat transfer as does a solderless thermal spreader package, such as a diamond material in direct contact with a die, IHS, and/or heat sink.

A suitable SAB process is described in "A New Wafer-Bonder of Ultra-High Precision Using Surface Activated Bonding (SAB) Concept", T. Suga, M. M. R. Howlader, T. Itoh, C. Inaka, Y. Arai, A. Yamauchi, Proceedings of the 2001 IEEE Electronic Components and Technology Conference, Lake Buena Vista, Fla., May 29–Apr. 1, 2001. A suitable SAB process can join two dissimilar materials due to the adhesion force between atoms of two atomically clean surfaces in an ultra high vacuum (e.g. $10^{-8}$ Pascals) at room temperature. The surfaces of the two materials can be cleaned by any suitable mechanism, such as an Argon ion beam. When suitable pressure is applied (e.g. 500 Newtons), bonding between the two materials is achieved at room temperature.

In an embodiment wherein a thermal spreader is separately formed and is subsequently affixed between an IHS surface and a die surface, for example, the diamond thermal spreader surfaces may optionally be coated with one or more suitable adhesion layers such as those mentioned earlier, namely, metal from a group that includes chromium, gold, nickel, platinum, silver, titanium, tungsten, and vanadium, or alloys thereof. Generally, any metal, alloy, or other substance that can be polished can be used.

Subsequently, the IHS surface, the thermal spreader surfaces, and the die surface can be cleaned by an Argon ion beam in an ultra high vacuum chamber at room temperature. The cleaning of components can be performed concurrently or sequentially in any suitable manner.

Subsequently, in one embodiment, the IHS, thermal spreader, and/or die are compressed by suitable pressure to achieve room temperature bonding. The IHS surface is bonded to one surface of the thermal spreader, and/or the die surface is bonded to the other surface of the thermal spreader.

Similar SAB operations can be performed to achieve bonding between an IHS, a diamond thermal spreader, and/or a heat sink in any desired combination.

It should be noted that an SAB process may not be suitable, due to the significant pressure involved, if delicate structure has already been coupled to the components to be bonded, e.g. if a ball grid array has been coupled to the die. However, with suitable protection for any delicate structure, e.g. an appropriate underfill for a ball grid array, an SAB process may still be feasible.

The above-described composition, dimensions, number, and order of layers are merely exemplary of the embodiments illustrated, and they are not meant to be limiting.

Figure 7:
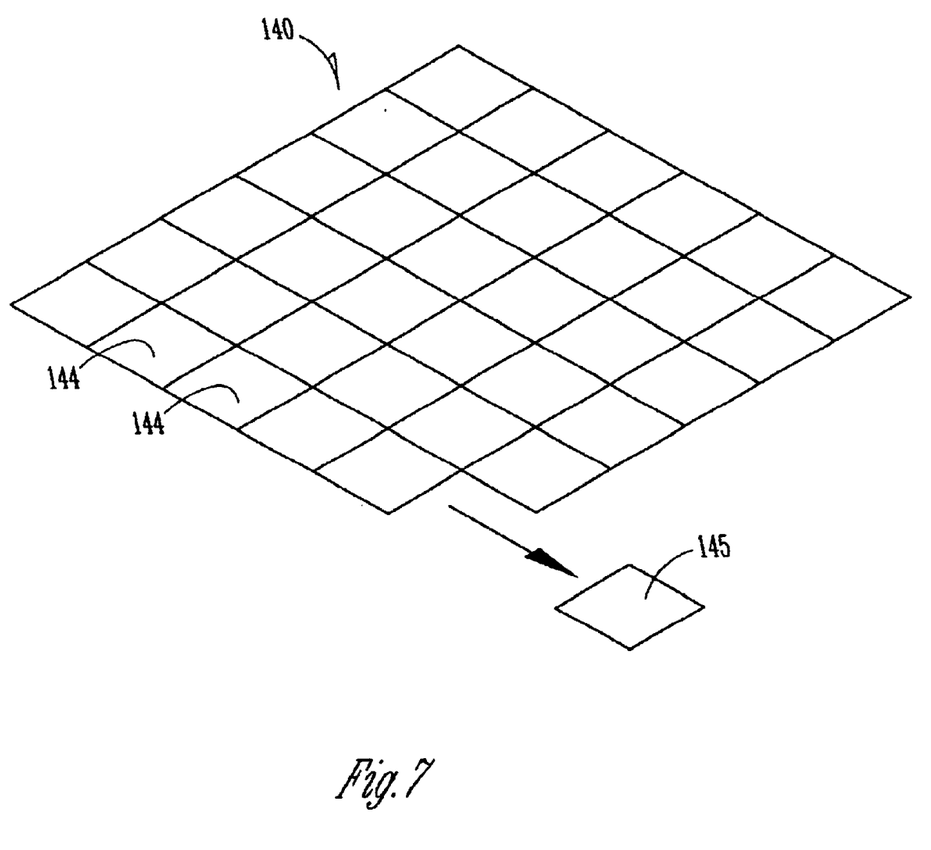
FIG. 7 is a view of a wafer of diamond thermal spreader material, which has been grown separate from an IHS, and a segment thereof prior to attachment to an IHS, in accordance with another embodiment of the invention.

FIG. 7 is a view of a wafer 140 of diamond thermal spreader material, which has been grown separate from an IHS, and a segment 145 thereof prior to attachment to an IHS, in accordance with another embodiment of the invention.

The thermal spreader 111 described in FIG. 6, including any adhesion layers 151–156, will typically be formed in a large wafer 140 comprising a plurality of individual thermally conductive elements 144. These elements can be separated from wafer 140. For example, element 145 has been separated from wafer 140.

Figure 8:
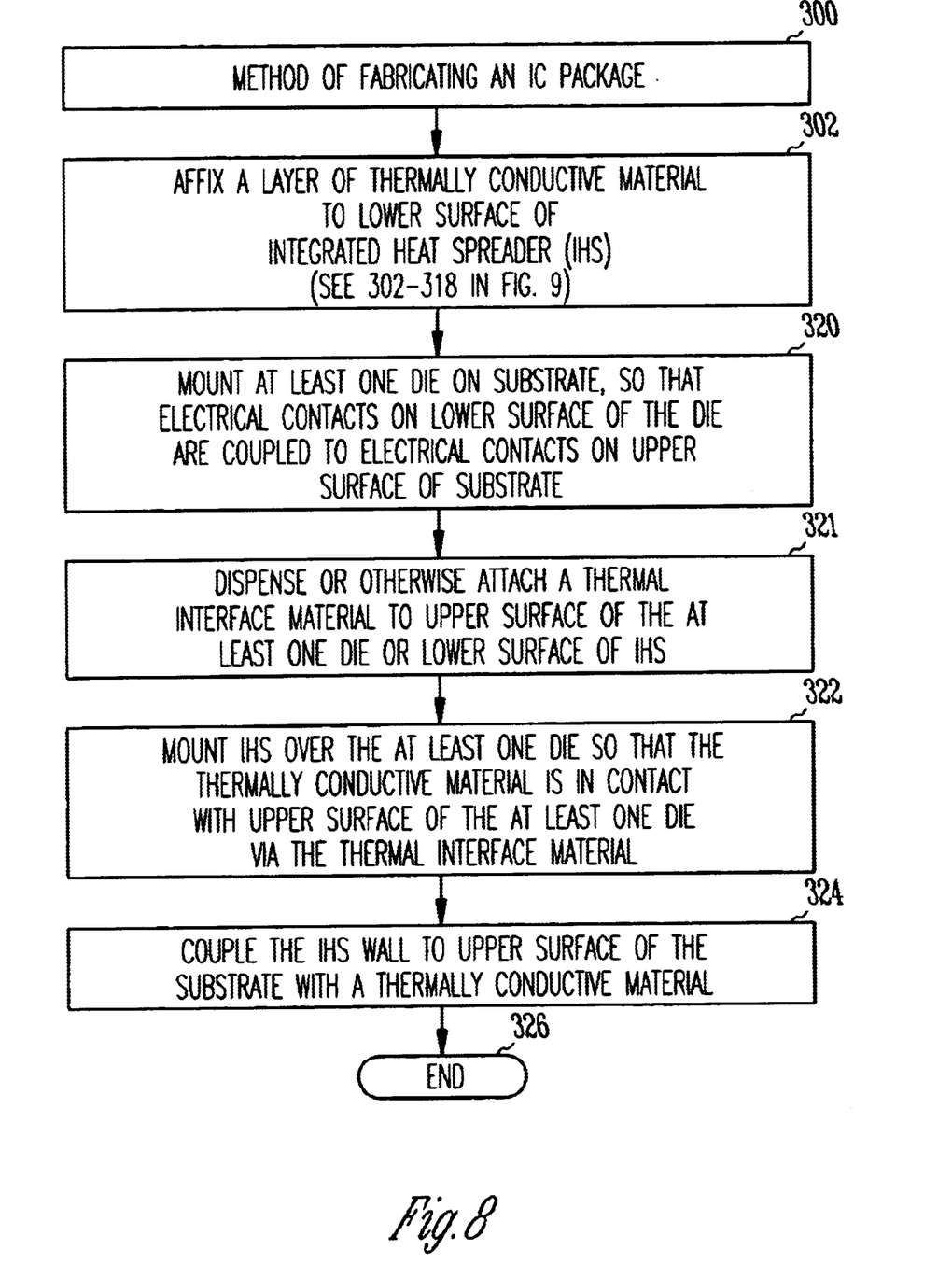
FIG. 8 is a flow diagram of a method of fabricating an IC package, in accordance with one embodiment of the invention.

FIG. 8 is a flow diagram of a method of fabricating an IC package, in accordance with one embodiment of the invention. The method begins at 300.

In 302, a layer of thermally conductive material, also referred to herein as a thermal spreader (e.g. thermal spreader 110, FIG. 3), is affixed to the lower surface (e.g. 58, FIG. 3) of an integrated heat spreader (IHS) (e.g. 120, FIG. 3). For further details concerning this operation, refer to FIG. 9 and its description below.

Still referring to FIG. 8, in 320, at least one die (e.g. 40, FIG. 3) is mounted on a substrate (e.g. 50, FIG. 3), so that electrical contacts on a lower surface of the die are coupled to corresponding contacts (e.g. 52, FIG. 3) on the upper surface (e.g. 56, FIG. 3) of the substrate.

In 321, a thermal interface material is dispensed over or otherwise attached to the upper surface of the at least one die or the lower surface of the IHS (or more precisely to the thermal interface material affixed to the lower surface of the IHS). The thermal interface material can comprise any of the thermal interface materials discussed above, such as solder, a thermal grease or gel, a phase change material, etc. The thermal interface material significantly improves heat transfer between the die and the IHS, because in this particular example the layer of thermally conductive material is not physically affixed to the IHS as via an SAB process.

In 322, the IHS is mounted over at least one die so that the thermally conductive material is in contact with an upper surface of the die via the thermal interface material.

In 324, the IHS wall (e.g. 124, FIG. 3) is coupled to the upper surface of the substrate with a thermally conductive material (e.g. 66, FIG. 3).

A suitable process for performing 322 and 324 will now be described with reference to FIG. 3. In one embodiment, solder paste is first applied to the back side of the die 40. (I.e. in this embodiment, the thermal interface material of 321 comprises solder rather than thermal gel or grease.) Alternatively, the solder paste could be applied to the surface of the thermally conductive element or thermal spreader 110 that faces the back side of the die 40. Then a suitable sealant 66 is applied to the OLGA substrate 50 where the periphery or boundary of IHS 120 will make contact when it is positioned over the die 40.

Next, the IHS 120 is aligned, and an appropriate force can be applied, for example using a spring, to hold IHS 120 in position. The package is then put into a suitable heating environment, such as a flow furnace, for solder reflow. Following solder join of the thermal spreader, the sealant at the IHS boundary is cured in a conventional oven. Post cure, the securing spring is removed.

The method illustrated in FIG. 8 ends at 326.

Figure 9:
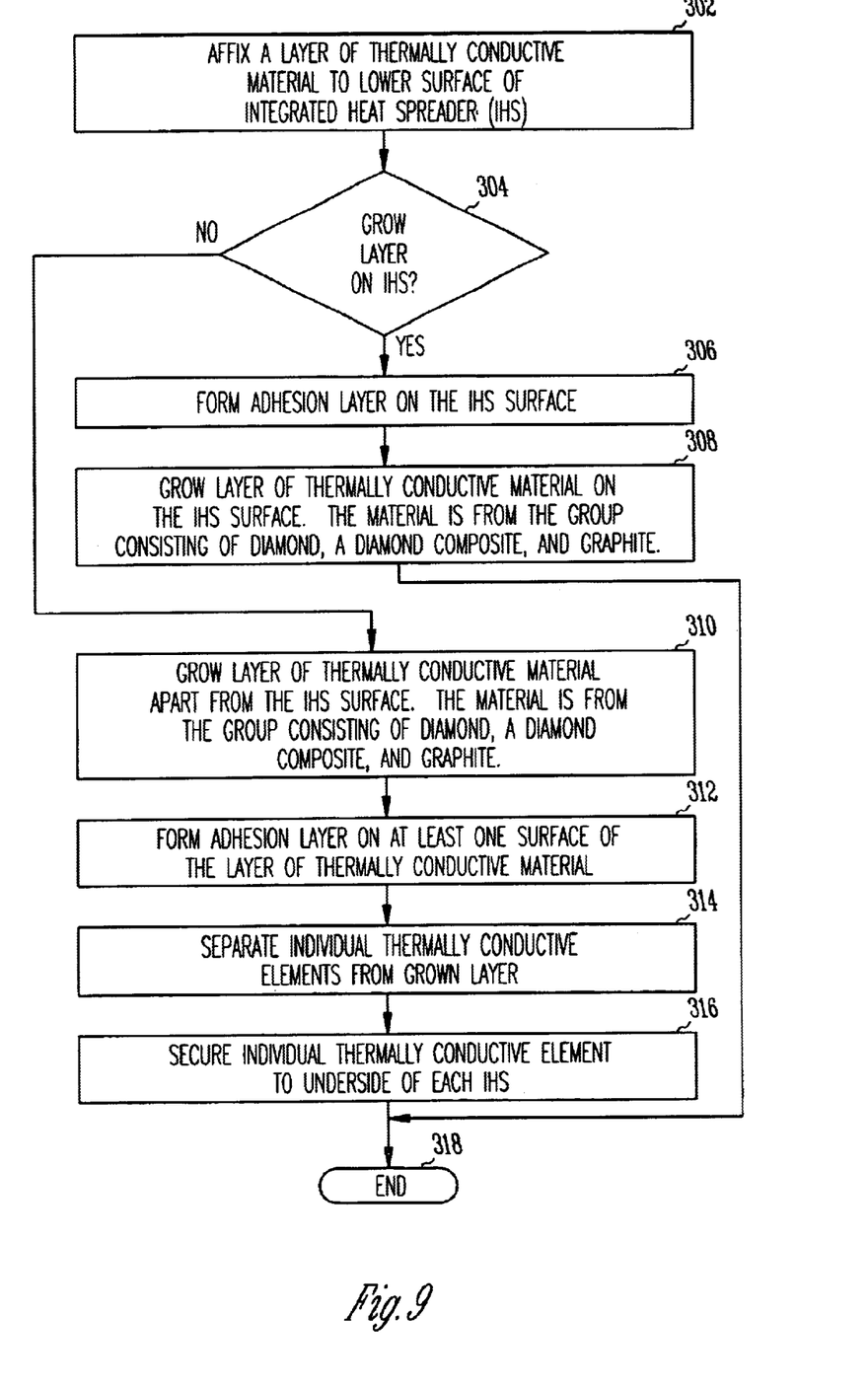
FIG. 9 is a flow diagram of two alternative methods of affixing a layer of thermally conductive material to an integrated heat spreader (IHS)

FIG. 9 is a flow diagram of two alternative methods of affixing a layer of thermally conductive material to an integrated heat spreader (IHS). FIG. 9 elaborates upon 302 of FIG. 8.

In 304, a determination is made whether a layer of thermally conductive material is to be grown on the lower surface of the IHS. If yes, the method proceeds to 306; otherwise, it proceeds to 310.

In 306, an adhesion layer (e.g. one or more layers 131–133, FIG. 5) is formed on the IHS surface.

In 308, a layer of thermally conductive material (e.g. 110, FIG. 5) is grown on the adhesion layer of the IHS surface. The material is from the group consisting of diamond, a diamond composite, and graphite.

In 310, a layer of thermally conductive material (e.g. 111, FIG. 5) is grown apart from the IHS surface. The material is from the group consisting of diamond, a diamond composite, and graphite. The layer can be grown in the form of a wafer (140, FIG. 7).

In 312, an adhesion layer (e.g. one or more layers 151–156, FIG. 6) is formed on at least one surface of the layer of thermally conductive material.

In 314, individual thermally conductive elements (e.g. 145, FIG. 7) are separated from the grown layer.

In 316, individual thermally conductive elements are secured to the under side of each IHS (e.g. 120, FIG. 6). The methods end at 318.

Figure 10:
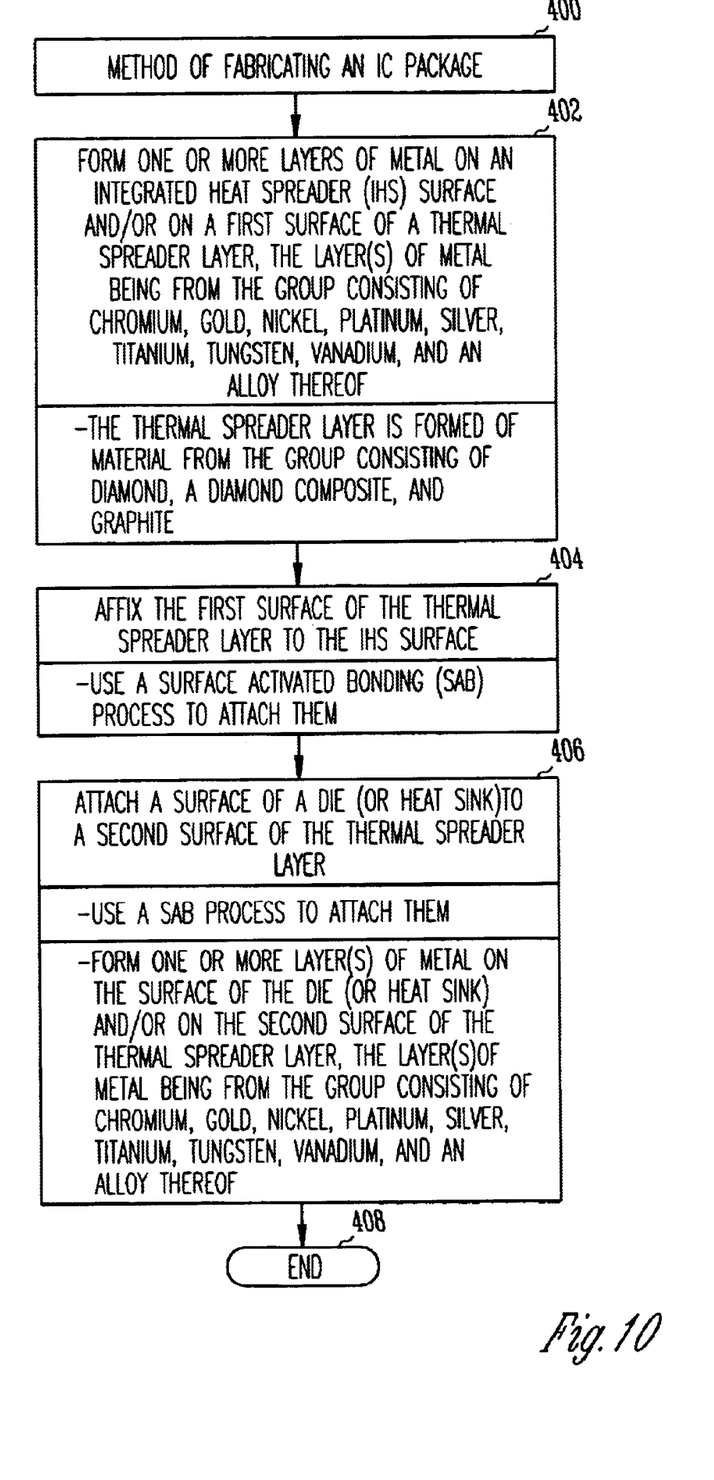
FIG. 10 is a flow diagram of several alternative methods of fabricating an IC package, or an electronic assembly, in accordance with various embodiments of the invention.

FIG. 10 is a flow diagram of several alternative methods of fabricating an IC package, or an electronic assembly, in accordance with various embodiments of the invention. The alternative methods begin at 400.

In 402, one or more layers of metal can optionally be formed on an IHS surface and/or on a first surface of a thermal spreader layer. The one or more layers of metal can be adhesion layers. They can be from the group consisting of chromium, gold, nickel, platinum, silver, titanium, tungsten, vanadium, and an alloy of any two or more of such metals. The thermal spreader layer is formed of material from the group consisting of diamond, a diamond composite, and graphite.

In 404, the first surface of the thermal spreader layer is affixed to the IHS surface. An SAB process, essentially as described earlier, can be used to attach the first surface of the thermal spreader layer to the IHS surface. By applying the SAB process to a metal surface, rather than to a diamond surface, fabrication costs can be reduced, because the production resources required to polish a diamond surface are generally less than those required to polish a metal surface. The same principle applies to polishing a diamond composite or graphite surface. However, in an alternative embodiment, the SAB process could be performed directly on the surface of the thermal spreader layer.

In 406, a surface of a die (e.g. die 40, FIG. 3) is attached to a second surface of the thermal spreader layer (e.g. in this case, thermal spreader 110). An SAB process is used to attach the die surface to the second surface of the thermal spreader layer. In an alternative embodiment, a surface of a heat sink (e.g. heat sink 80, FIG. 3) is attached to the second surface of the thermal spreader layer (e.g. in this case, thermal spreader 108).

One or more layers of metal can optionally be formed on the die surface and/or on a second surface of the thermal spreader layer.

In the embodiment wherein a surface of a heat sink is attached to the second surface of the thermal spreader layer, the one or more layers of metal are formed on the heat sink surface.

The one or more layers of metal can be adhesion layers. They can be from the group consisting of chromium, gold, nickel, platinum, silver, titanium, tungsten, vanadium, and an alloy of any two or more of such metals.

It can be advantageous, in some embodiments, to attach the die surface (or heat sink surface, in another embodiment) directly to the thermal spreader layer for improved heat transfer without one or more intervening metal adhesion layers that typically provide for less heat transfer than a thermal dissipating material formed of diamond, a diamond composite, or graphite.

In yet another embodiment, two thermal spreader layers are used in the electronic assembly package. One thermal spreader layer (e.g. thermal spreader 108) lies between a heat sink surface and an IHS surface. The other thermal spreader layer (e.g. thermal spreader 110) lies between another IHS surface and a die surface. The methods end at 408.

The operations described above with respect to the methods illustrated in FIGS. 8 through 10 can be performed in a different order from those described herein.

The above-described choice of materials; geometry; number, order, dimensions, and composition of layers; mechanisms for affixing; and assembly sequencing can all be varied by one of ordinary skill in the art to optimize the thermal performance of the package.

Any suitable method, or combination of different methods, for depositing the metal layers can be used, such as plating, sputtering, vapor, electrical, screening, stenciling, chemical including chemical vapor deposition (CVD), vacuum, and so forth.

Before deposition of the one or more metal layers, the surface of the die can be prepared with a sputter etch, if desired, to improve the adhesion of the adhesion layer to the die surface; however, a sputter etch is not essential. Nor is the condition of the wafer surface essential. The wafer surface can be in unpolished, polished, or background form.

The particular implementation of the IC package is very flexible in terms of the orientation, size, number, order, and composition of its constituent elements. Various embodiments of the invention can be implemented using various combinations of substrate technology, IHS technology, high capacity thermal spreader material, adhesion materials, and sealant to achieve the advantages of the present invention. The structure, including types of materials used, dimensions, layout, geometry, and so forth, of the IC package can be built in a wide variety of embodiments, depending upon the requirements of the electronic assembly of which it forms a part.

FIGS. 3–7 are merely representational and are not drawn to scale. Certain proportions thereof may be exaggerated, while others may be minimized. FIGS. 3–7 are intended to illustrate various implementations of the invention that can be understood and appropriately carried out by those of ordinary skill in the art.

The present invention provides for an electronic assembly and methods of manufacture thereof that minimize thermal dissipation problems associated with high power delivery. An electronic system and/or data processing system that incorporates one or more electronic assemblies that utilize the present invention can handle the relatively high power densities associated with high performance integrated circuits, and such systems are therefore more commercially attractive.

By substantially increasing the thermal dissipation from high performance electronic assemblies, such electronic equipment can be operated at increased clock frequencies. Alternatively, such equipment can be operated at reduced clock frequencies but with lower operating temperatures for increased reliability.

As shown herein, the present invention can be implemented in a number of different embodiments, including a heat-dissipating structure, an integrated circuit package, an electronic assembly, an electronic system in the form of a data processing system, and various methods of fabricating an IC package. Other embodiments will be readily apparent to those of ordinary skill in the art. The elements, materials, geometries, dimensions, and sequence of operations can all be varied to suit particular packaging requirements.

While certain operations have been described herein relative to "upper" and "lower" surfaces, it will be understood that these descriptors are relative, and that they would be reversed if the IC package were inverted. Therefore, these terms are not intended to be limiting.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of fabricating an integrate circuit package, the method comprising:
    affixing a layer of thermally conductive material to a lower surface of an integrated heat spreader (IHS), the material being from the group consisting of diamond, a diamond composite, and graphite;
    mounting a die on a substrate, so that electrical contacts on a lower surface of the die are coupled to electrical contacts on an upper surface of the substrate; and
    mounting the IHS over the die so that the thermally conductive material is in contact with the upper surface of the die.

2. The method recited in claim 1 wherein affixing comprises:
    growing the layer of thermally conductive material on the IHS surface.

3. The method recited in claim 2 and further comprising:
    forming a layer of metal on the IHS surface, the layer of metal being from the group consisting of chromium, gold, nickel, platinum, silver, titanium, tungsten, and vanadium.

4. The method recited in claim 1 and further comprising:
    growing the layer of thermally conductive material apart from the IHS surface.

5. The method recited in claim 4 and further comprising:
    forming a layer of metal on at least one surface of the layer of thermally conductive material, the layer of metal being from the group consisting of titanium and tungsten.

6. The method recited in claim 1 wherein the IHS comprises a wall, the method further comprising:
    coupling the IHS wall to the upper surface of the substrate.

7. The method recited in claim 6 wherein the IHS wall is coupled to the upper surface of the substrate with a thermally conductive material.

8. A method of fabricating an integrate circuit package, the method comprising:
    affixing a first surface of a thermal spreader layer to a surface of an integrated heat spreader (IHS), the thermal spreader layer being formed of material from the group consisting of diamond, a diamond composite, and graphite; and
    attaching a surface of a die to a second surface of the thermal spreader layer.

9. The method recited in claim 8 wherein affixing comprises:
    attaching the first surface of the thermal spreader layer to the IHS surface using a surface activated bonding process.

10. The method recited in claim 9 wherein attaching the first surface of the thermal spreader layer to the IHS surface further comprises:
    forming a layer of metal on the IHS surface, the layer of metal being from the group consisting of chromium, gold, nickel, platinum, silver, titanium, tungsten, vanadium, and an alloy thereof.

11. The method recited in claim 9 wherein attaching the first surface of the thermal spreader layer to the IHS surface further comprises:
    forming a layer of metal on the first surface of the thermal spreader layer, the layer of metal being from the group consisting of chromium, gold, nickel, platinum, silver, titanium, tungsten, vanadium, and an alloy thereof.

12. The method recited in claim 8 wherein attaching comprises:
    attaching the surface of the die to the second surface of the thermal spreader layer using a surface activated bonding process.

13. The method recited in claim 12 wherein attaching further comprises:
    forming a layer of metal on the surface of the die, the layer of metal being from the group consisting of chromium, gold, nickel, platinum, silver, titanium, tungsten, vanadium, and an alloy thereof.

14. The method recited in claim 12 wherein attaching further comprises:
forming a layer of metal on the second surface of the thermal spreader layer, the layer of metal being from the group consisting of chromium, gold, nickel, platinum, silver, titanium, tungsten, vanadium, and an alloy thereof.

15. The method recited in claim 8 and further comprising:
before attaching, applying a thermal interface material to the surface of the die, or to the second surface of the thermal spreader layer, or to both the surface of the die and to the second surface of the thermal spreader layer.

16. A method of fabricating an integrate circuit package, the method comprising:
affixing a first surface of a thermal spreader layer to a surface of an integrated heat spreader (IHS), the thermal spreader layer being formed of material from the group consisting of diamond, a diamond composite, and graphite; and
attaching a surface of a heat sink to a second surface of the thermal spreader layer.

17. The method recited in claim 16 wherein affixing comprises:
attaching the first surface of the thermal spreader layer to the IHS surface using a surface activated bonding process.

18. The method recited in claim 17 wherein attaching the first surface of the thermal spreader layer to the IHS surface further comprises:
forming a layer of metal on the IHS surface, the layer of metal being from the group consisting of chromium, gold, nickel, platinum, silver, titanium, tungsten, vanadium, and an alloy thereof.

19. The method recited in claim 17 wherein attaching the first surface of the thermal spreader layer to the IHS surface further comprises:
forming a layer of metal on the first surface of the thermal spreader layer, the layer of metal being from the group consisting of chromium, gold, nickel, platinum, silver, titanium, tungsten, vanadium, and an alloy thereof.

20. The method recited in claim 16 wherein attaching comprises:
attaching the surface of the heat sink to the second surface of the thermal spreader layer using a surface activated bonding process.

21. The method recited in claim 20 wherein attaching further comprises:
forming a layer of metal on the surface of the heat sink, the layer of metal being from the group consisting of chromium, gold, nickel, platinum, silver, titanium, tungsten, vanadium, and an alloy thereof.

22. The method recited in claim 20 wherein attaching further comprises:
forming a layer of metal on the second surface of the thermal spreader layer, the layer of metal being from the group consisting of chromium, gold, nickel, platinum, silver, titanium, tungsten, vanadium, and an alloy thereof.

23. The method recited in claim 16 and further comprising:
before attaching, applying a thermal interface material to the surface of the heat sink, or to the second surface of the thermal spreader layer, or to both the surface of the heat sink and to the second surface of the thermal spreader layer.

* * * * *

UNITED STATES PATENT AND TRADEMARK OFFICE
CERTIFICATE OF CORRECTION

PATENT NO.    : 6,706,562 B2
DATED         : March 16, 2004
INVENTOR(S)   : Gregory M. Chrysler and Ravi V. Mahajan It is certified that error appears in the above-identified patent and that said Letters Patent is hereby corrected as shown below:

Column 15,
Line 55, delete "integrate" and insert -- integrated -- therefor.

Column 16,
Line 27, delete "integrate" and insert -- integrated -- therefor.

Column 17,
Line 14, delete "integrate" and insert -- integrated -- therefor.

Signed and Sealed this

Twentieth Day of July, 2004

JON W. DUDAS
*Acting Director of the United States Patent and Trademark Office*